(12) United States Patent
Tanaka et al.

(10) Patent No.: US 6,826,388 B1
(45) Date of Patent: Nov. 30, 2004

(54) MOBILE COMMUNICATION APPARATUS INCLUDING DIVIDERS IN TRANSMITTER AND RECEIVER

(75) Inventors: Satoshi Tanaka, Kokubunji (JP); Kazuo Watanabe, Takasaki (JP); Masao Hotta, Hannou (JP); Toyohiko Hongo, Musashimurayama (JP); Taizo Yamawaki, Tokyo (JP); Masumi Kasahara, Takasaki (JP); Kumiko Takikawa, Tama (JP)

(73) Assignee: Renesas Technology Corp., Tokyo (JP)

( * ) Notice: Subject to any disclaimer, the term of this patent is extended or adjusted under 35 U.S.C. 154(b) by 499 days.

(21) Appl. No.: 09/711,105

(22) Filed: Nov. 14, 2000

(30) Foreign Application Priority Data

Nov. 15, 1999 (JP) .......................................... 11-323656

(51) Int. Cl.⁷ ................................................ H04B 1/40
(52) U.S. Cl. .......................... 455/77; 455/84; 455/141; 455/209
(58) Field of Search .............................. 455/77, 84, 85, 455/127.1, 127.2, 127.3, 136, 141, 182.3, 183.1, 192.3, 197.2, 197.3, 209, 240.1, 241.1, 255, 259, 260, 314, 315, 323; 330/252, 259, 270, 278, 290, 295, 97

(56) References Cited

U.S. PATENT DOCUMENTS

| | | | | |
|---|---|---|---|---|
| 4,731,796 A | * | 3/1988 | Masterton et al. | 375/223 |
| 5,617,060 A | | 4/1997 | Wilson et al. | |
| 5,867,777 A | * | 2/1999 | Yamaji et al. | 455/234.1 |
| 6,006,079 A | * | 12/1999 | Jaffee et al. | 455/310 |
| 6,298,226 B1 | * | 10/2001 | Lloyd et al. | 455/296 |
| 6,317,064 B1 | * | 11/2001 | Ferrer et al. | 341/118 |
| 6,356,217 B1 | * | 3/2002 | Tilley et al. | 341/118 |
| 6,480,063 B2 | * | 11/2002 | Ichihara | 330/133 |
| 6,560,447 B2 | * | 5/2003 | Rahman | 455/232.1 |

FOREIGN PATENT DOCUMENTS

| | | |
|---|---|---|
| EP | 0678974 | 10/1995 |
| EP | 0 719 013 | 6/1996 |
| EP | 0800283 | 10/1997 |
| WO | 95/30275 | 11/1995 |
| WO | 98/10523 | 3/1998 |

OTHER PUBLICATIONS

K. Takakawa et al, "RF Circuits Technique of Dual–band Transceiver IC for GSM and DCS1800 Applications", IEEE 25th European Solid–State Circuits Conference, 1999, pp. 278–281.

B. Razavi, "A 900–MHz CMOS Direct Conversion Receiver", IEEE Symposium on VLSI Circuits, 1997, pp. 113–114.

A. Abidi, "Direct–Conversion Radio Transceivers for Digital Communications", IEEE Journal of Solid–State Circuits, V. 30/N. 12, Dec. 1995, pp. 1399–1410.

* cited by examiner

*Primary Examiner*—Charles Craver
(74) *Attorney, Agent, or Firm*—Mattingly, Stanger & Malur, P.C.

(57) ABSTRACT

A transceiver suitable for larger scale of integration employs direct conversion reception for reducing the number of filters. Also, the number of VCOs is reduced by utilizing dividers to supply a receiver and a transmitter with locally oscillated signals at an RF band. Dividers each having a fixed division ratio are used for generating locally oscillated signals for the receiver, while a divider having a switchable division ratio are used for generating the locally oscillated signal for the transmitter. In addition, a variable gain amplifier for baseband signal is provided with a DC offset voltage detector and a DC offset canceling circuit for supporting high speed data communications to accomplish fast cancellation of a DC offset by eliminating intervention of a filter within a feedback loop for offset cancellation.

8 Claims, 18 Drawing Sheets

FIG.12

| m | fIF$_G$ [MHZ] |
|---|---|
| 1 | 2820 |
| 2 | 970 |
| 4 | 45 |
| 8 | 417.5 |
| 16 | 648.75 |
| 32 | 764.375 |

FIG.13

| n | fIF$_D$ [MHZ] |
|---|---|
| 1 | 1900 |
| 2 | 95 |
| 4 | 807.5 |
| 8 | 1258.75 |
| 16 | 1484.375 |
| 32 | 1597.1875 |

GSM Spurious

| fIF[MHz] | 42 | 44 | 45 | 46 | 46 | 48 | 50 | 52 |
|---|---|---|---|---|---|---|---|---|
| m-> | 21 | 20 | 20 | 19 | 20 | 19 | 18 | 17 |
| fVCO[MHz] | | | | | | | | |
| 880 | 2 | 0 | 20 | 6 | 40 | 32 | 20 | 4 |
| 882 | 0 | 2 | 18 | 8 | 38 | 30 | 18 | 2 |
| 884 | 2 | 4 | 16 | 10 | 36 | 28 | 16 | 0 |
| 886 | 4 | 6 | 14 | 12 | 34 | 26 | 14 | 2 |
| 888 | 6 | 8 | 12 | 14 | 32 | 24 | 12 | 4 |
| 890 | 8 | 10 | 10 | 16 | 30 | 22 | 10 | 6 |
| 892 | 10 | 12 | 8 | 18 | 28 | 20 | 8 | 8 |
| 894 | 12 | 14 | 6 | 20 | 26 | 18 | 6 | 10 |
| 896 | 14 | 16 | 4 | 22 | 24 | 16 | 4 | 12 |
| 898 | 16 | 18 | 2 | 24 | 22 | 14 | 2 | 14 |
| 900 | 18 | 20 | 0 | 26 | 20 | 12 | 0 | 16 |
| 902 | 20 | 22 | 2 | 28 | 18 | 10 | 2 | 18 |
| 904 | 22 | 24 | 4 | 30 | 16 | 8 | 4 | 20 |
| 906 | 24 | 26 | 6 | 32 | 14 | 6 | 6 | 22 |
| 908 | 26 | 28 | 8 | 34 | 12 | 4 | 8 | 24 |
| 910 | 28 | 30 | 10 | 36 | 10 | 2 | 10 | 26 |
| 912 | 30 | 32 | 12 | 38 | 8 | 0 | 12 | 28 |
| 914 | 32 | 34 | 14 | 40 | 6 | 2 | 14 | 30 |

FIG.18

DCS/1800 Spurious

| fIF[MHz] | 84 | 86 | 88 | 90 | 92 | 94 | 96 | 98 | 100 | 102 | 104 | 106 |
|---|---|---|---|---|---|---|---|---|---|---|---|---|
| m-> | 21 | 20 | 20 | 19 | 19 | 19 | 18 | 18 | 17 | 17 | 17 | 16 |
| fVCO[MHz] | | | | | | | | | | | | |
| 1710 | 54 | 10 | 50 | 0 | 38 | 76 | 18 | 54 | 10 | 24 | 58 | 14 |
| 1714 | 50 | 6 | 46 | 4 | 34 | 72 | 14 | 50 | 14 | 20 | 54 | 18 |
| 1718 | 46 | 2 | 42 | 8 | 30 | 68 | 10 | 46 | 18 | 16 | 50 | 22 |
| 1722 | 42 | 2 | 38 | 12 | 26 | 64 | 6 | 42 | 22 | 12 | 46 | 26 |
| 1726 | 38 | 6 | 34 | 16 | 22 | 60 | 2 | 38 | 26 | 8 | 42 | 30 |
| 1730 | 34 | 10 | 30 | 20 | 18 | 56 | 2 | 34 | 30 | 4 | 38 | 34 |
| 1734 | 30 | 14 | 26 | 24 | 14 | 52 | 6 | 30 | 34 | 0 | 34 | 38 |
| 1738 | 26 | 18 | 22 | 28 | 10 | 48 | 10 | 26 | 38 | 4 | 30 | 42 |
| 1742 | 22 | 22 | 18 | 32 | 6 | 44 | 14 | 22 | 42 | 8 | 26 | 46 |
| 1746 | 18 | 26 | 14 | 36 | 2 | 40 | 18 | 18 | 46 | 12 | 22 | 50 |
| 1750 | 14 | 30 | 10 | 40 | 2 | 36 | 22 | 14 | 50 | 16 | 18 | 54 |
| 1754 | 10 | 34 | 6 | 44 | 6 | 32 | 26 | 10 | 54 | 20 | 14 | 58 |
| 1758 | 6 | 38 | 2 | 48 | 10 | 28 | 30 | 6 | 58 | 24 | 10 | 62 |
| 1762 | 2 | 42 | 2 | 52 | 14 | 24 | 34 | 2 | 62 | 28 | 6 | 66 |
| 1766 | 2 | 46 | 6 | 56 | 18 | 20 | 38 | 2 | 66 | 32 | 2 | 70 |
| 1770 | 6 | 50 | 10 | 60 | 22 | 16 | 42 | 6 | 70 | 36 | 2 | 74 |
| 1774 | 10 | 54 | 14 | 64 | 26 | 12 | 46 | 10 | 74 | 40 | 6 | 78 |
| 1778 | 14 | 58 | 18 | 68 | 30 | 8 | 50 | 14 | 78 | 44 | 10 | 82 |
| 1782 | 18 | 62 | 22 | 72 | 34 | 4 | 54 | 18 | 82 | 48 | 14 | 86 |
| 1785 | 21 | 65 | 25 | 75 | 37 | 1 | 57 | 21 | 85 | 51 | 17 | 89 |

Total frequency range of RFVCO
= 3.61 − 3.84 GHz(230 MHz, 6.2%)

Total frequency range of RFVCO
= 3.61 − 4.00 GHz(390 MHz, 10.2%)

MOBILE COMMUNICATION APPARATUS INCLUDING DIVIDERS IN TRANSMITTER AND RECEIVER

BACKGROUND OF THE INVENTION

1. Field of the Invention

The present invention relates generally to a mobile communication apparatus which can be implemented with a less number of components, and more particularly, to a transceiver which employs a direct conversion scheme suitable for larger scale of integration.

2. Description of the Related Art

With explosive popularization of mobile communication apparatus, requirements for a reduction in size and cost have been increased. For this reason, it is desired to eliminate VCO (voltage controlled oscillator), reduce the number of filters, and apply integrated circuits with a higher degree of integration. A prior art example of a transceiver which meets such requirements is described in K. Takikawa et. al., "RF Circuits Technique of Dual-Band Transceiver IC for GSM and DCS1800 applications," IEEE 25th European Solid-State Circuits Conference Preprints pp. 278–281, 1999. The configuration of this transceiver is illustrated in FIG. 10A. The illustrated transceiver comprises an integrated circuit 1016, and other components 1001–1015 which are connected external to the integrated circuit 1016. The prior art example supports two frequency bands, i.e., 900 MHz band and 1.8 GHz band. Also, the transceiver employs a superheterodyne scheme for a receiver and an offset PLL scheme for a transmitter. The superheterodyne receiver requires two RF (high frequency) filters 1001, 1002 for suppressing out-of-band blocker signals; two image rejection filters 1003, 1004 for rejecting blocker signals in an image frequency band associated with mixing; and an IF (intermediate frequency) filter 1005 for filtering out blocker signals near a reception channel. The receiver also requires two local oscillators 1006, 1007 for supporting the two frequency bands, i.e., 900 MHz band and 1.8 GHz band.

A reception scheme which can reduce the number of externally connected components is a direct conversion scheme. A prior art example of a direct conversion receiver is described in Behzad Razavi, "A 900-MHz CMOS Direct Conversion Receiver," IEEE Symposium on VLSI Circuits, pp. 113–114, 1997. The configuration of this receiver is illustrated in FIG. 10B. Since no image response exists in principle, the direct conversion scheme does not require an image rejection filter. Also, an IF filter is eliminated since it can be replaced by a filter integrated in an IC. In this prior art example, a VCO 1025 oscillates at a frequency twice an input frequency of the receiver which is in a range of 1850–1920 MHz. When this receiver is applied to GSM, DCS1800 dual band receiver, the VCO 1025 must oscillate in a range of 1850 to 1920 MHz (for GSM) and in a range of 3610 to 3760 MHz (for DCS1800). However, since it is difficult for a single VCO to cover these frequency bands, two VCOs are required.

A widely known drawback of the direct conversion receiver is a DC offset voltage. This is generated because an input signal to mixers 1019, 1020 is equal to a locally oscillated signal in frequency. For example, if the locally oscillated signal leaks into an input terminal for an input signal, locally oscillated signals are mutually multiplied to generate DC offset voltage. A prior art example of a scheme for canceling the DC offset voltage is described in Asad A. Abidi et. al,. "Direct-Conversion Radio Transceivers for Digital Communications," IEEE Journal of Solid-State Circuits, pp. 1399–1410, vol. 30, no. 12. December 1995. The configuration of this transceiver is illustrated in FIG. 11. An output DC offset voltage of a variable gain amplifier composed of variable gain amplifiers 1101, 1103, 1105 and low pass filters 1102, 1104 is detected by a digital signal processor (DSP) 1106. The DSP 1106 outputs a DC offset voltage cancel signal to an input of the variable gain amplifier 1101 based on the detected information.

SUMMARY OF THE INVENTION

As described above, in the direct conversion receiver, the number of externally connected filters can be reduced. However, if the direct conversion receiver is used in place of the superheterodyne receiver in the GSM, DCS1800 dual band transceiver of FIG. 10A, the number of local oscillators is increased. This is because the transmitter requires a locally oscillated frequency in a range of 1150 to 1185 MHz (for GSM) and in a range of 1575 to 1650 MHz (for DCS1800), and the receiver requires a locally oscillated frequency in a range of 1850 to 1920 MHz (for GSM) and in a range of 3610 to 3760 MHz (for DCS1800), but a single VCO encounters difficulties in covering a plurality of bands. For a further reduction in cost, a reduction in the number of VCOs is a primary subject.

Also, in GPRS (General Packet Radio Service) which implements high speed data communications based on a GSM system, a plurality of slots are assigned to reception and transmission. Thus, fast DC offset voltage cancellation is required. In addition, the DC offset voltage cancellation must be performed every operation frame. First, the necessity for the fast offset cancellation is explained with reference to FIG. 4. One frame of GSM is comprised of eight slots, each of which has a duration of 577 $\mu$m. Assume herein a severe condition for the DC offset voltage cancellation, in which four slots are assigned to the reception (RX), and one slot is assigned to the transmission (TX). While a transmission slot TX1' is assigned to a slot 7, the transmission slot TX1' is transmitted at a timing of TX1, which is 237 $\mu$sec before the slot 7, in consideration of a propagation delay to a base station. Also, a monitoring period of approximately 500 $\mu$sec and a PLL synchronizing period are required other than transmission and reception. Assuming that the PLL synchronizing period lasts approximately 150 $\mu$sec, a time available for canceling the DC offset voltage, in which a transceiver does not operate, is calculated as 1154−500−237−150*2=117 $\mu$sec, thus requiring fast DC offset cancellation.

Next, the necessity for the offset cancellation performed every frame is explained with reference to FIGS. 5A–5B. FIGS. 5A–5B show a measuring circuit for measuring a received frequency dependency of an output DC offset voltage of a mixer, and the result of a measurement made thereby. The result of the measurement reveals that the output DC offset voltage has the frequency dependency. Therefore, in a system such as GSM, DCS1800, in which a received frequency is not fixed during a call but the frequency hops within a reception band, it is difficult to previously anticipate the DC offset voltage. Therefore, the DC offset voltage must be canceled every operation frame.

The scheme employed in the example of FIG. 11 is not suitable for high speed data communications since a filter intervening in a feedback loop for offset cancellation make the fast offset cancellation difficult. Therefore, the realization of a fast offset canceling scheme suitable for high speed data communications is a second subject.

To realize the first subject, in the present invention, a receiver and a transmitter are supplied with locally oscillated signals in an RF band from a single VCO utilizing dividers. Dividers each having a fixed division ratio are used for generating the locally oscillated signals for the receiver, while a divider having a switchable division ratio is used for generating the locally oscillated signal for the transmitter.

To realize the second subject, in the present invention, a variable gain amplifier for baseband signal is provided with a DC offset voltage detector and a DC offset canceling circuit to accomplish fast cancellation of a DC offset by eliminating intervention of a filter within a feedback loop for offset cancellation.

BRIEF DESCRIPTION OF THE DRAWINGS

FIG. 12 is a table showing IF frequencies of a transmitter for use in a GSM operation;

FIG. 13 is a table showing IF frequencies of the transmitter for use in a DCS1800 operation;

FIG. 18 is a table listing spurious in DSC1800 transmission;

DETAILED DESCRIPTION OF THE EMBODIMENTS

Figure 1:
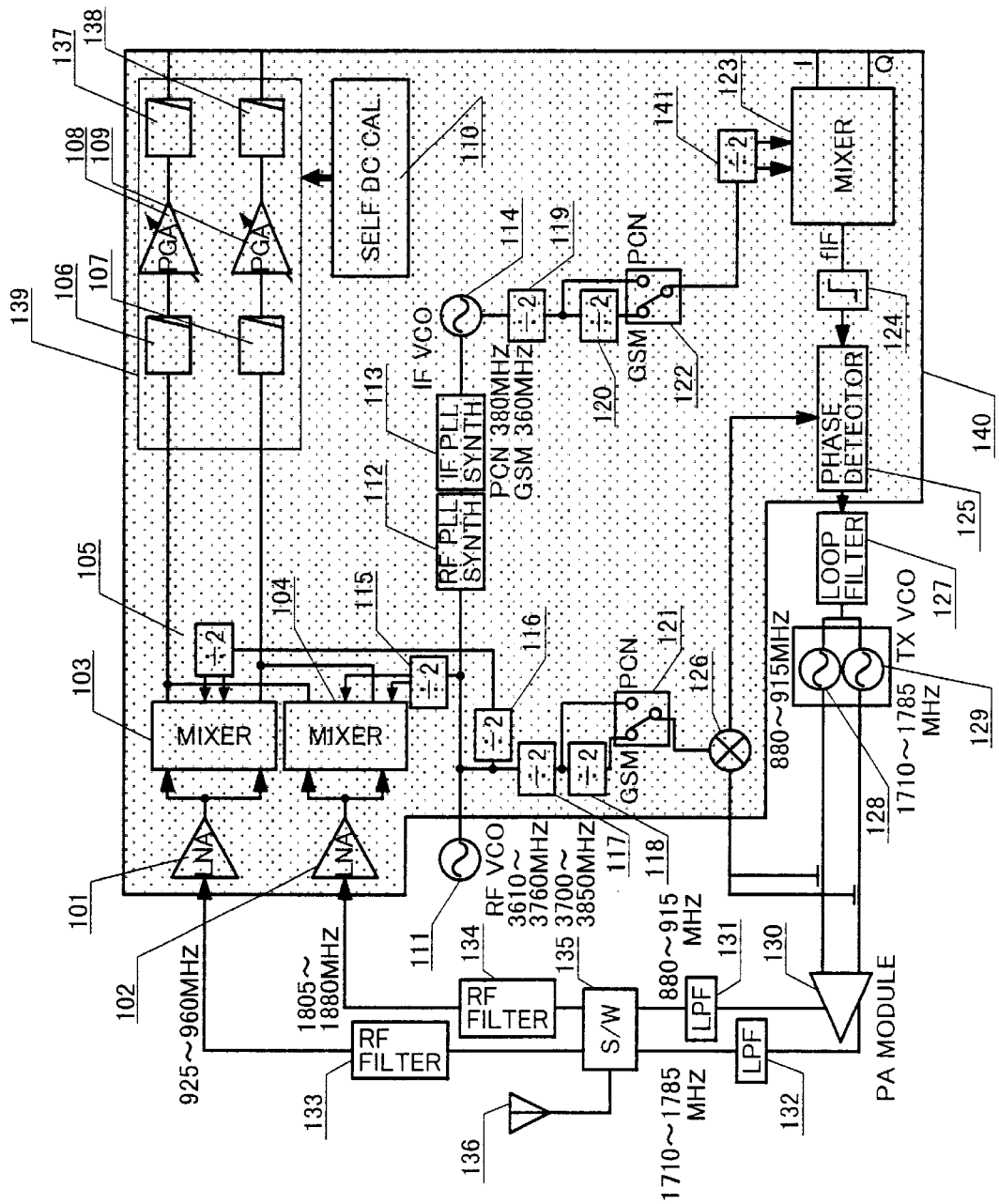
FIG. 1 is a block diagram illustrating the configuration of a mobile communication apparatus according to a first embodiment of the present invention.

A first embodiment of the present invention will be described with reference to FIG. 1. The first embodiment uses an exemplary mobile communication apparatus, as an application, which supports the European cellular telephone GSM (900 MHz band) and DCS1800 (1800 MHz band).

A direct conversion scheme is applied to a receiver for converting an RF signal directly to a baseband signal, and the offset PLL scheme, previously shown in the prior art example, is applied to a transmitter. The receiver comprises low noise amplifiers 101, 102; mixers 103, 104; and a variable gain low pass filter 139. Each of the mixers converts a signal frequency band from the RF band to the baseband, and simultaneously performs demodulation for separating an RF signal into a sine component and a cosine component. For this purpose, the mixers 103, 104 must be applied with locally oscillated signals which are shifted in phase by 90°. The locally oscillated signals are generated using dividers 105, 115. The locally oscillated signals are generated by a PLL loop formed of a VCO 111 and a PLL 112. When a VCO for oscillating in a 3600 MHz band is used for the VCO 111, the output of the divider 115 is in a 1800 MHz band and provides a locally oscillated signal for DCS1800. Also, as the divider 116 is positioned prior to the divider 105, an output frequency of the divider 105 is in a 900 MHz band and provides a locally oscillated signal for GSM. Output baseband signals of the mixers 103, 104 are inputted to a variable gain low pass filter 139 for level adjustment and blocker signal rejection. The variable gain low pass filter 139 comprises low pass filters 106, 107, 137, 138, and variable gain amplifiers 108, 109. Also, for suppressing a DC offset voltage at the output of the variable gain low pass filter 139, a DC offset voltage canceling circuit 110 is provided. The DC offset voltage canceling circuit 110 has a DC offset voltage detecting unit and a DC offset canceling unit.

For reducing the number of externally connected components, the transmitter also uses the same VCO 111 as the receiver. How to determine an IF frequency (fIF) used in the transmitter is explained below. Assume that reception frequencies received at an antenna 136 are $fr_G$ (for GSM) and $fr_D$ (for DCS1800); and a transmission frequencies are $ft_G$ (for GSM) and $ft_D$ (for DCS1800). As described above, since the oscillating frequency of the VCO 111 is four times the GSM reception frequency and twice the DSC1800 reception frequency, the oscillating frequency of the VCO 111 can be expressed as $4 \cdot fr_G = 2 \cdot fr_D$. When signals generated by dividing this oscillating frequency by m (GMS) and by n (DCS1800) are used as locally oscillated signals for a mixer 126 of an offset PLL, an IF frequency $fIF_G$ for GSM is expressed by the following equation 1:

$$fIF_G = \left| \frac{4 \cdot fr_G}{m} - ft_G \right| \qquad \text{equation 1}$$

Similarly, an IF frequency $fIF_D$ for DCS1800 is expressed by the following equation 2:

$$fIF_D = \left| \frac{2 \cdot fr_D}{n} - ft_D \right| \qquad \text{equation 2}$$

Assume herein that $fr_G$=925 MHz, $ft_G$=880 MHz, $fr_D$=1805 MHz, and $ft_D$=1710 MHz. The IF frequency $fIF_G$ calculated for m is shown in FIG. 12, and the IF frequency $fIF_D$ calculated for n is shown in FIG. 13. Since a divide-by-two divider is used for the frequency division, 2 to the i-th power (i is an integer number) is used for m and n. For employing a single VCO for generating the IF frequencies, m and n cannot be freely selected but must be selected such that $fIF_G$ is substantially equal to $fIF_D$. Also, when a divide-by-two divider is used, the ratio of $fIF_G$ to $fIF_D$ may be substantially equal to 2 to the j-th power (j is an integer number). Here, "substantially equal" means that the two frequencies may be included within an oscillating frequency range of the VCO even if they are not exactly the same. In FIGS. 12 and 13, combinations of m and n which satisfy the foregoing condition are (m, n)=(2, 1) and (4, 2). The IF frequencies fIF are eventually determined from such combinations of m and n in consideration of power consumption, the presence or absence of generation of an unwanted spurious signal, and so on. In this embodiment, a combination (m, n)=(4,2) is chosen. Dividers 117, 118 and a change-over switch 121 are provided subsequent to the VCO 111, and are controlled to divide the output frequency of VCO 111 by four for GSM and by two for DCS1800. Next, the oscillating frequency of the VCO 114 is determined depending on the power consumption, the scale of passive elements contained in IC, and so on. In this embodiment, the oscillating frequency of the VCO 114 is divided by eight for GSM and by four for DCS1800 to generate $fIF_G$=45 MHz and $fIF_D$=95 MHz by selecting the oscillating frequency in a 300 MHz band and providing dividers 119, 120 and a change-over switch 122 subsequent to the VCO 114.

Figure 17:
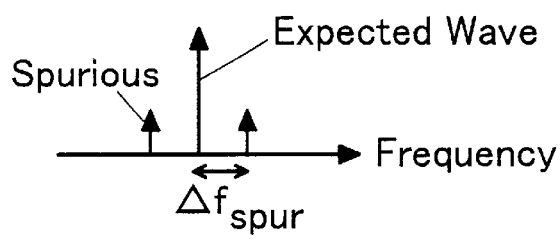
FIG. 17 is a table listing spurious in GSM transmission.

Next, the problem of spurious will be explained in a more specific manner. FIGS. 17, 18 show the spurious when the IF frequency is fixed, and the locally oscillated frequency is changed. FIGS. 17, 18, which correspond to GSM and DSC1800, show the spurious which results from the difference between an integer multiple (multiplied by m) of the IF frequency and the locally oscillated frequency when transmission signals are generated from transmission oscillators 128, 124. In the tables, fIF represents the IF frequency, and fVCO the transmission frequency. A numerical value written in each field shows the difference between a spurious signal and the transmission frequency in units of MHz. Hatched fields indicate the spurious generated nearby within 10 MHz, which are not easily removed by a loop filter 127 of the transmitter. As will be understood from FIGS. 17, 18, when the IF frequency is fixed, it is difficult to avoid a region in which the spurious appears near the transmission frequency within the transmission band, and the effectiveness of varying the IF frequency depending on the transmission frequency is understandable. For example, in the example of GSM shown in FIG. 17, the spurious can be avoided by selecting the IF frequency at 45 MHz from 880 MHz to 888 MHz and selecting the IF frequency at 46 MHz from 888 MHz to 914 MHz.

Figure 16:
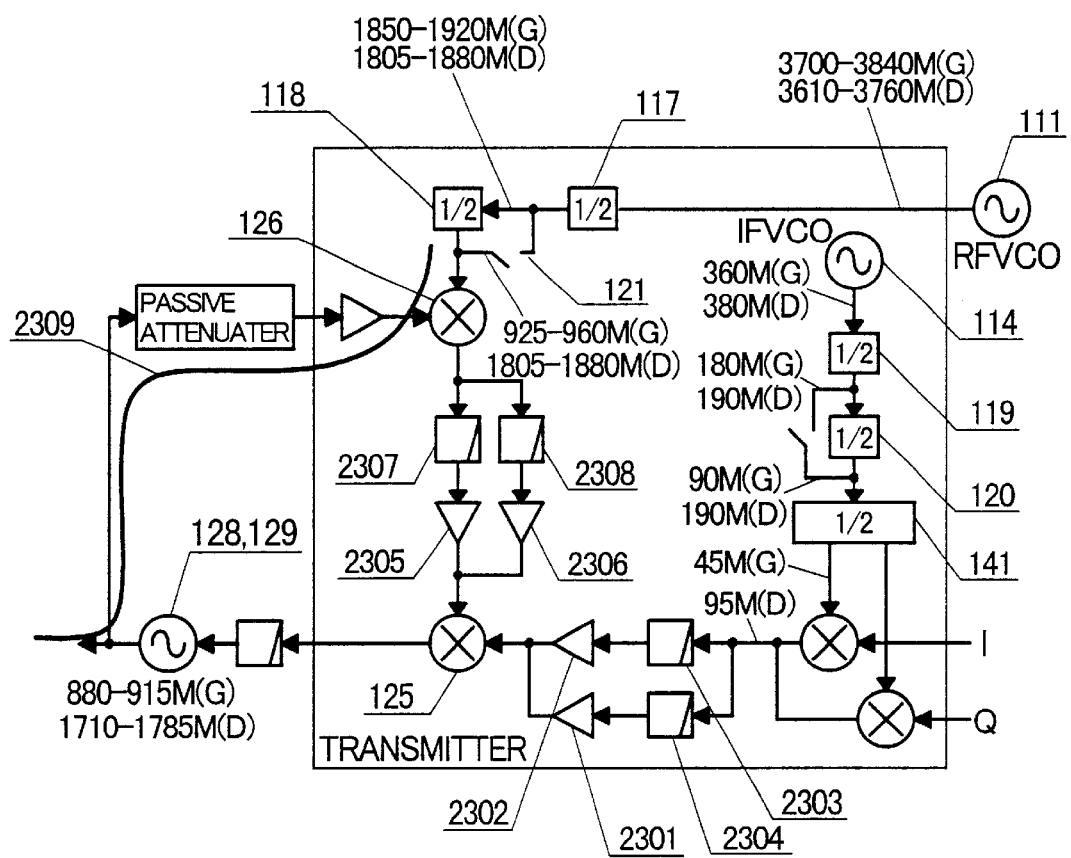
FIG. 16 is a block diagram illustrating a GSM/DCS1800 dual band transmitter.
Figure 19:
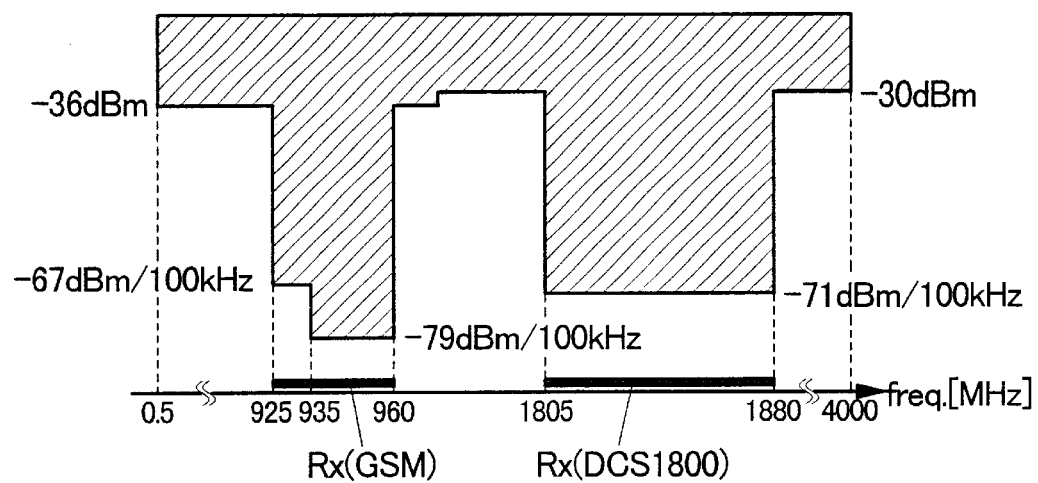
FIG. 19 shows a GSM spurious standard.
Figure 20:
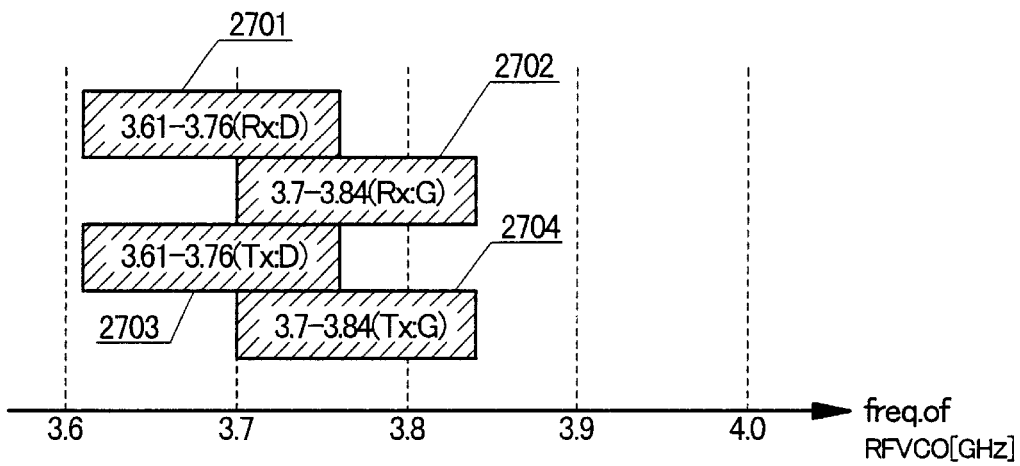
FIG. 20 shows allocation of VCO oscillating frequencies in which locally oscillated frequency bands are coincident for transmission and reception.
Figure 21:
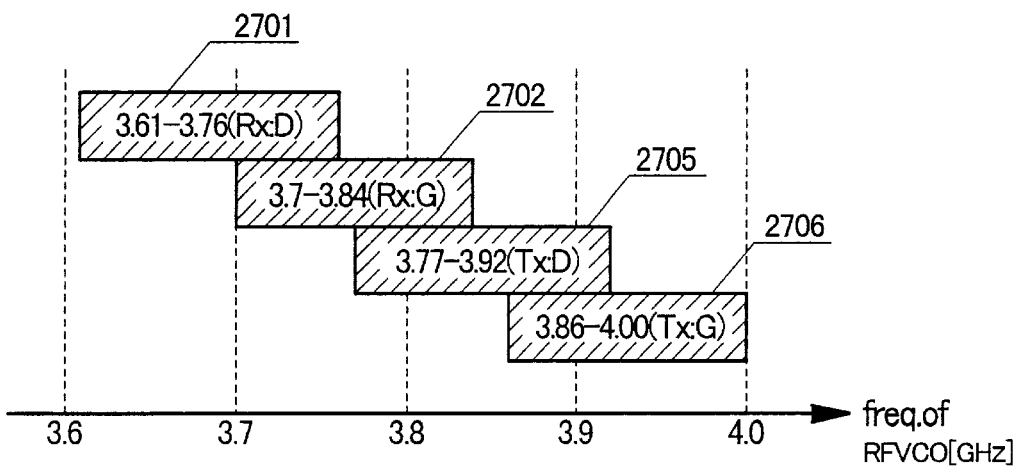
FIG. 21 shows allocation of VCO oscillating frequencies in which locally oscillated frequency bands do not overlap for transmission and reception.

In this embodiment, the locally oscillated signal applied to the mixer 126 in the transmitter exists within the reception band. FIG. 16 illustrates the transmitter of this embodiment in an enlarged view. The locally oscillated signal existing within the reception band leaks through a path designated by 2309, and amplified by an amplifier at a later stage and irradiated. A standard related to the irradiation of the spurious in GSM is summarized in FIG. 19. While the spurious within the reception band is allowed only at five points and at a level of −36 dBm or lower, it is desired to suppress the spurious to −79 dBm/100 kHz in principle. FIG. 20 summarizes the oscillating frequencies of the VCO so far explained in the foregoing embodiment. A reception band 2701 and a transmission band 2703 for DCS1800 are coincident, and a reception band 2702 and a transmission band 2704 for GSM are coincident as well. For shifting these bands from each other, consider a frequency allocation as shown in FIG. 21. A transmission band 2705 shifted from the reception band 2701 for DCS1800 does not overlap the reception band 2701, so that the leakage of the locally oscillated frequency within the reception band during transmission can be avoided. The same is applied to GSM as well.

Figure 2:
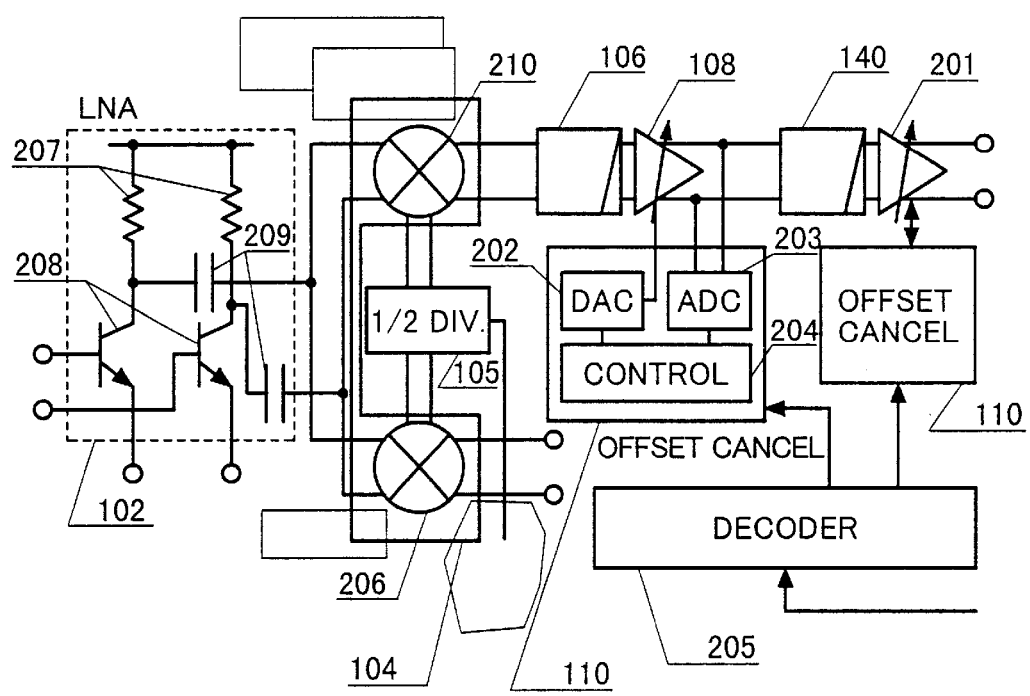
FIG. 2 is a block diagram illustration a receiver of the mobile communication apparatus according to the present invention.

Next, a receiver according to a second embodiment of the present invention will be described with reference to FIG. 2.

The illustrated receiver comprises a low noise amplifier 102; a mixer 104; a divider 105; low pass filters 106, 137; variable gain amplifiers 108, 201; DC offset voltage canceling circuits 110; and a decoder 205. The low noise amplifier 102 in turn comprises a load resistor 207; a transistor 208; and a capacitance 209, while the DC offset voltage canceling circuit 110 comprises a digital-to-analog converter (DAC) 202; an analog-to-digital converter (ADC) 203; and a controller 204. The mixer 104 comprises mixers 210, 206.

An output DC voltage of the variable gain amplifier 108 is converted to a digital signal by the ADC 203, and inputted to the controller 204. The controller 204 measures the DC offset voltage at the output of the variable gain amplifier 108 to output a cancel signal for canceling the DC offset voltage. The cancel signal is converted from a digital signal to an analog signal by the DAC 202, and an output signal of the DAC 202 cancels the DC offset voltage of the variable gain amplifier 108. The decoder 205 selects one of the DC offset voltage canceling circuits 110, such that only the selected circuit is operative. In this way, since no filter intervenes within a feedback loop comprised of the variable gain amplifier and the DC offset voltage canceling circuit, a delay otherwise caused by the filter is eliminated, thereby making it possible to realize fast offset cancellation. Here, it is also possible to employ a one-bit ADC, i.e., a simple comparator.

Figure 3:
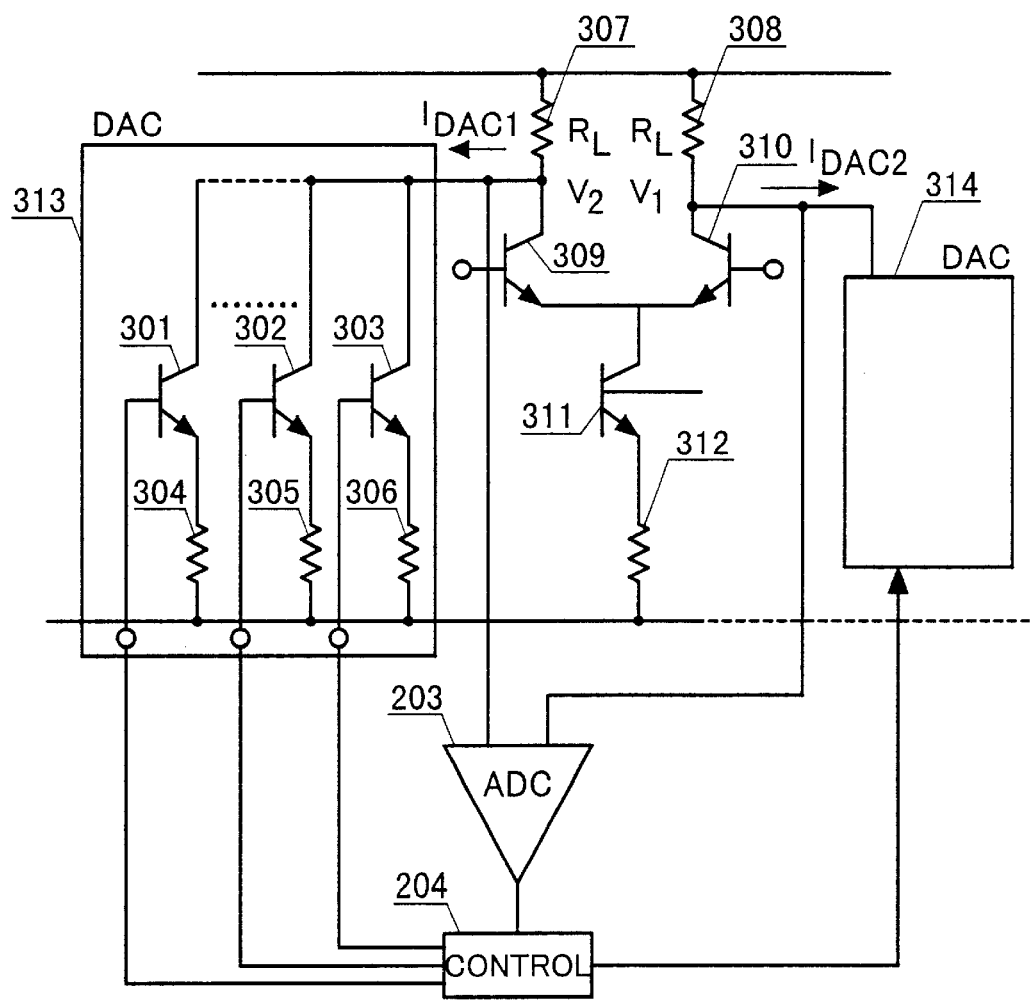
FIG. 3 is a circuit diagram illustrating in detail a circuit for removing a DC offset of a receiver according to the present invention.
Figure 4:
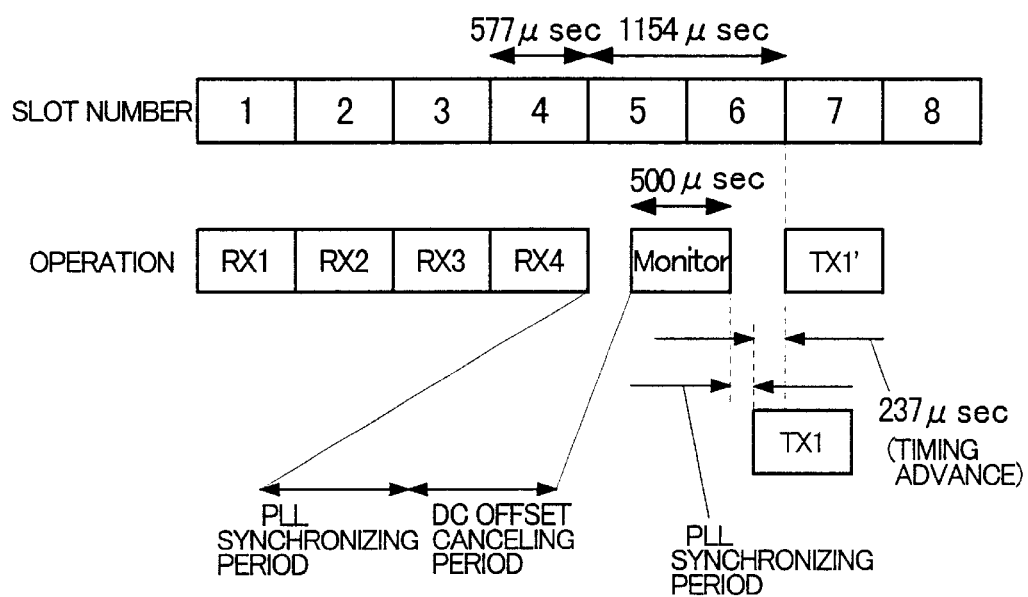
FIG. 4 is an operation timing diagram in a GSM standard.
Figure 5A:
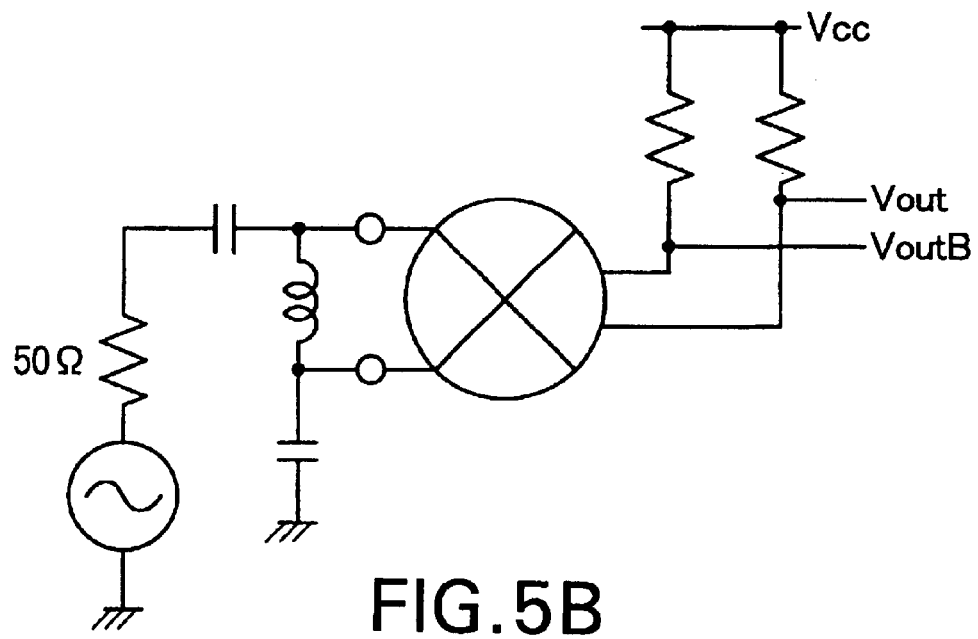
FIGS. 5A–5B show a method of measuring a DC offset voltage generated by a mixer, and the result of a measurement made by the method.
Figure 5B:
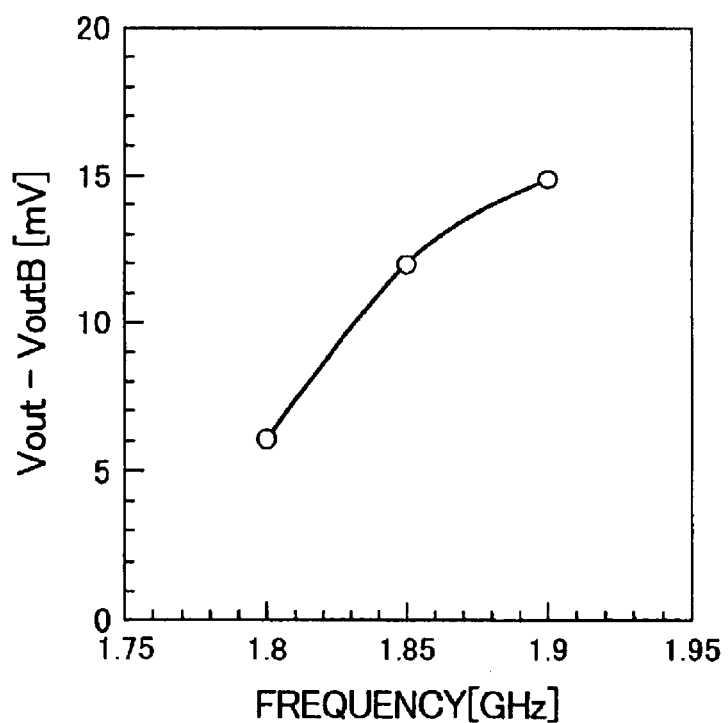

Next, a variable gain amplifier and a DC offset voltage canceling circuit according to a third embodiment of the present invention will be described with reference to FIG. 3.

The variable gain amplifier comprises resistors 307, 308, 312; and transistors 309, 310, 311. The transistors 309, 310 are applied with an input voltage at their bases to deliver output voltages from their collectors. The gain can be controlled, for example, by a base voltage of the transistor 311. A DAC 313 comprises transistors 301, 302, 303; and resistors 304, 305, 306. Since the output of a controller 204 is connected to bases of the transistors 301, 302, 303, the controller 204 can control collector DC currents of the transistors 301, 302, 303. The collector DC currents are summed with a collector current of the transistor 309, and then converted to a voltage by the resistor 307. Assume now that a DC offset voltage $\Delta V$ (=$V_2$-$V_1$) exists, and the resistance of the resistors 307, 308 are represented by $R_L$; an output DC current of the DAC 313 by $I_{DAC1}$; and an output DC current of the DAC 314 by $I_{DAC2}$. In this event, the controller 204 controls the DACs 313, 314 to satisfy the relationship expressed by equation 3:

$$R_L \cdot (I_{DAC1} - I_{DAC2}) = \Delta V \qquad \text{equation 3}$$

Figure 6A:
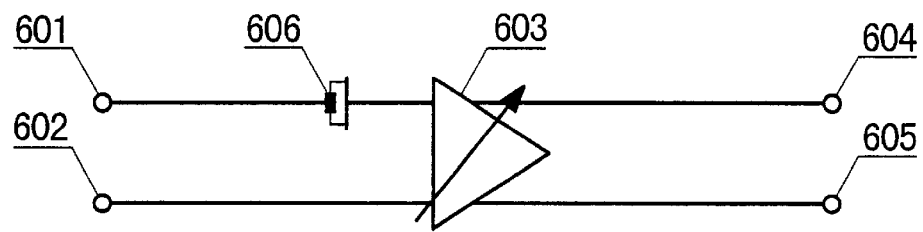
FIGS. 6A, 6B, 6C are diagrams illustrating the principles of the operation of a chopper amplifier which can be applied to the present invention.
Figure 6B:
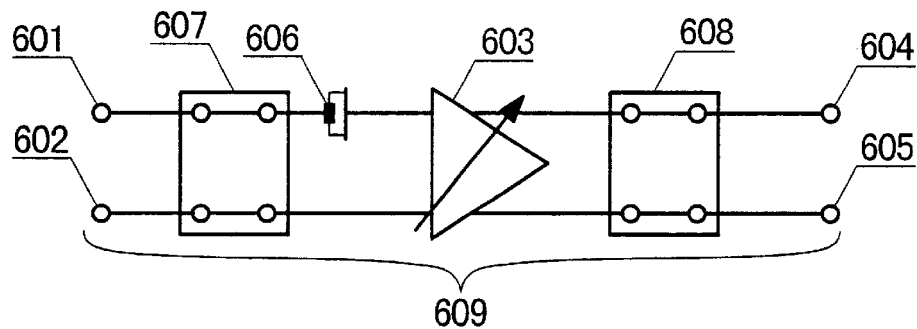
Figure 6C:
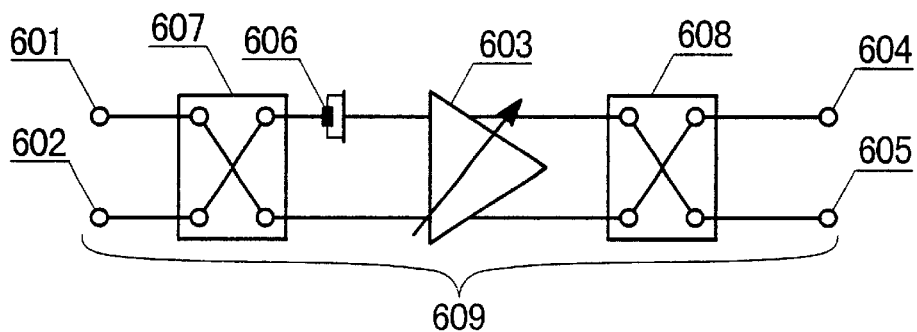

Next, a variable gain amplifier according to a fourth embodiment of the present invention will be described with reference to FIGS. 6A–6C. FIG. 6A illustrates an ideal variable gain amplifier 603 free from a DC offset voltage, and an input conversion DC offset voltage source 606 for the variable gain amplifier 603. In this configuration, since no means is provided for suppressing an offset voltage, an output voltage of the offset voltage source 606 multiplied by the gain of the variable gain amplifier 603 appears as an offset between output terminals 604, 605. Next, FIGS. 6B, 6C illustrate configurations in which change-over switches 607, 608, i.e., the third embodiment according to the present invention, are connected to the input and output of the variable gain amplifier 603. Since FIG. 6B is opposite to FIG. 6C in the connection relationship of the change-over switches 607 and 608, an output voltage of the offset voltage source 606 is transmitted to an opposite terminal, i.e., to 604 in FIG. 6B and to 605 in FIG. 6C, while maintaining the connection relationship between the input and output terminals. Therefore, when the aforementioned change-over switches 607, 608 are periodically changed over, the output voltage of the offset voltage source 606 appears at the output terminals 604, 605 for the same time, so that the offset voltage between the output terminals becomes zero.

Figure 7:
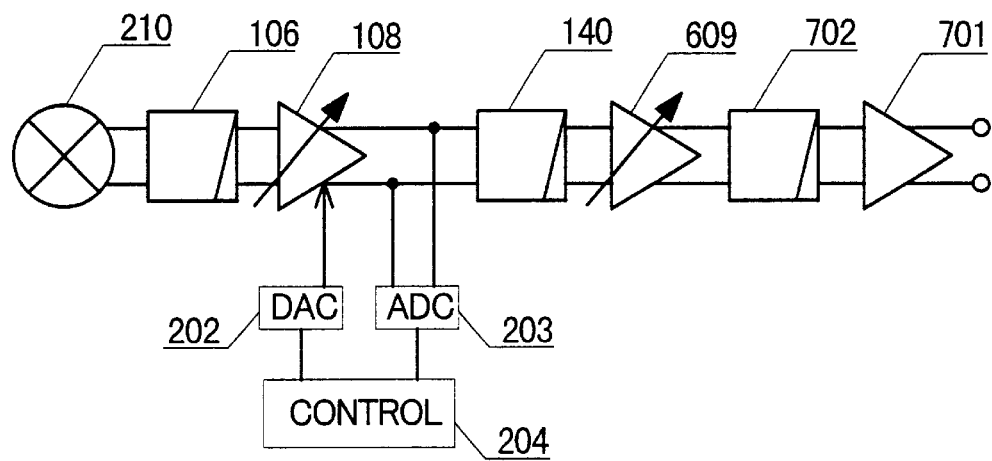
FIG. 7 is a block diagram illustrating an embodiment in which a chopper amplifier is applied to the receiver of the present invention.

Next, a receiver according to a fifth embodiment of the present invention will be described with reference to FIG. 7. This embodiment shows a receiver characterized in that the variable gain amplifier 609 shown in the third embodiment is employed in place of the variable gain amplifier 201 and the DC offset voltage canceling circuit 206 in the second embodiment, and a low pass filter 702 and a buffer amplifier 701 are connected subsequent to the variable gain amplifier 609.

Figure 8:
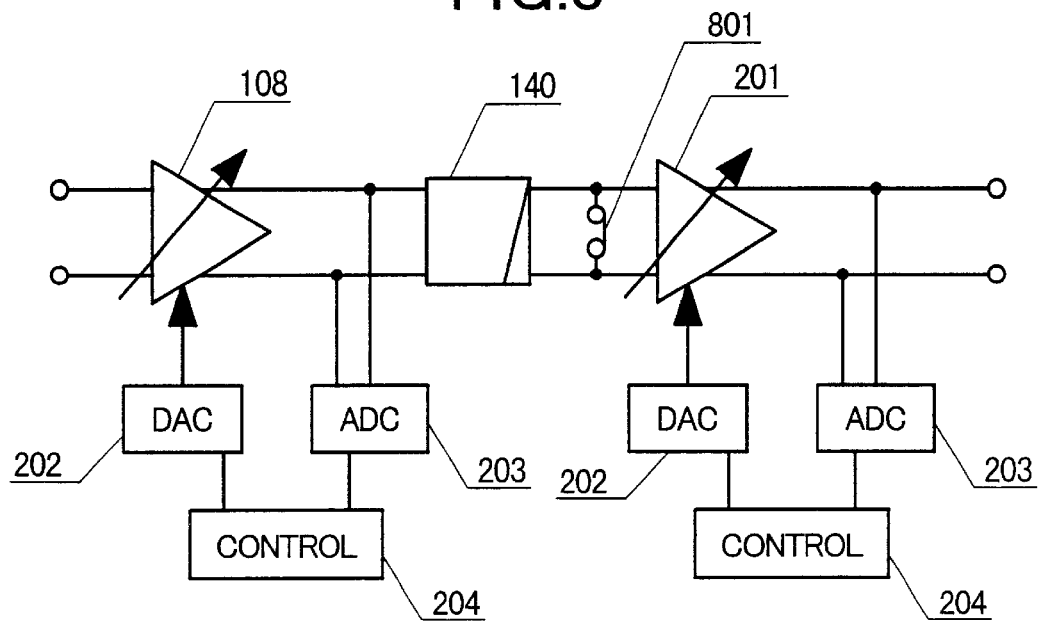
FIG. 8 is a block diagram illustrating a circuit for canceling a DC offset voltage for a variable gain amplifier without influence of a previous circuit in the receiver of the present invention.

Next, a receiver according to a sixth embodiment of the present invention will be described with reference to FIG. 8. This embodiment shows a receiver characterized in that a switch 801 is connected between the low pass filter 140 and the variable gain amplifier 201 in the second embodiment. For canceling a DC offset voltage, the switch 801 is turned on to short-circuit inputs of the variable gain amplifier 201, and the switch 801 is maintained off when the cancellation is not performed. By turning on the switch 801 upon starting the cancellation, the variable gain amplifier 201 can perform the cancellation without being affected by a DC offset voltage from the previous stage.

Figure 9:
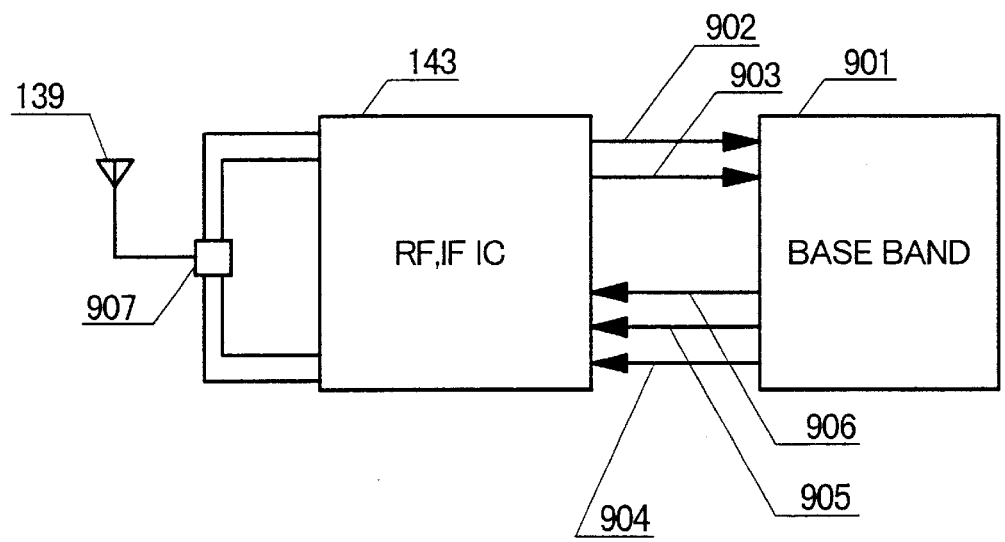
FIG. 9 is a block diagram showing that a timing signal for removing a DC offset can be provided from a baseband circuit.
Figure 10A:
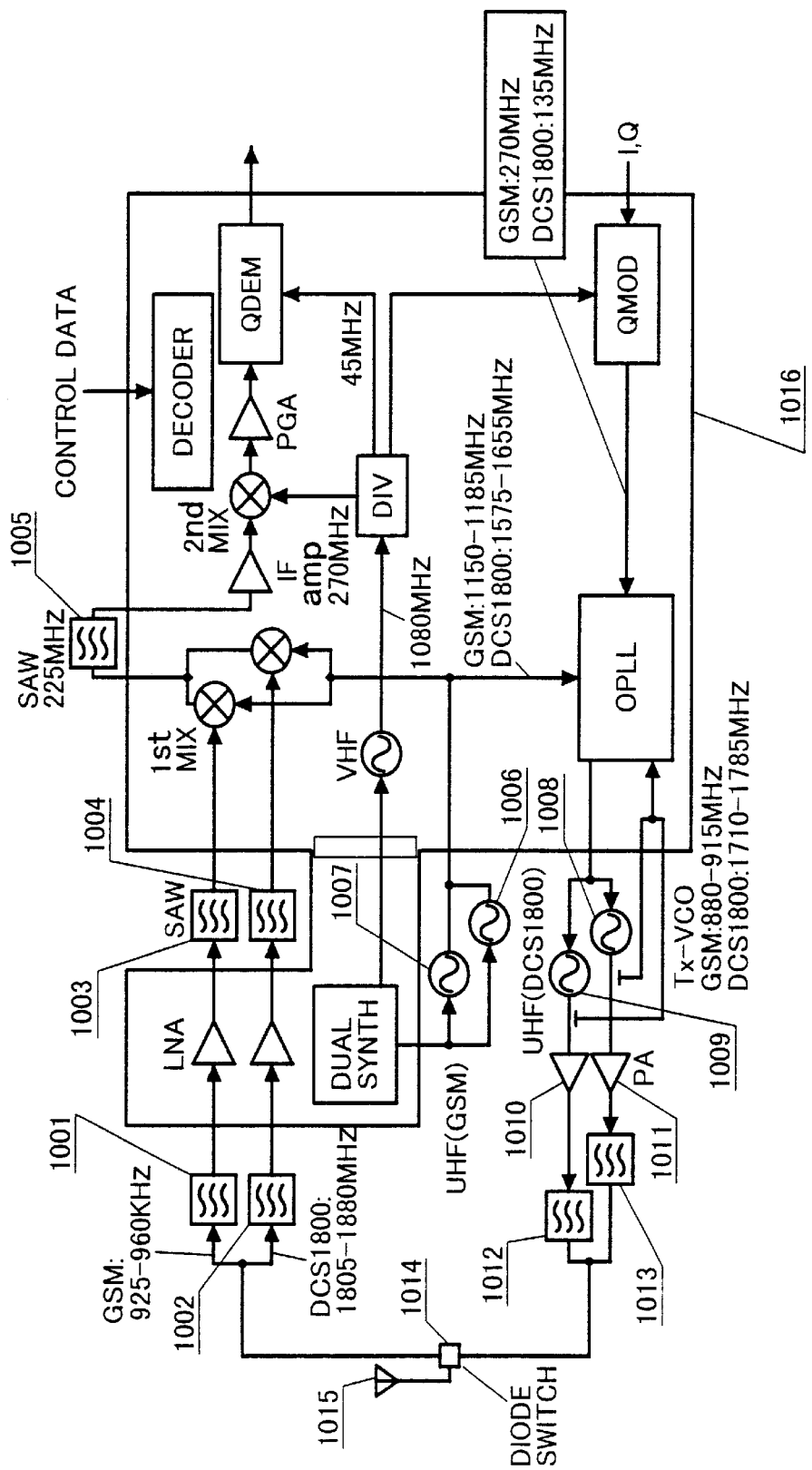
FIG. 10A is a block diagram illustrating the configuration of a mobile communication apparatus to which a conventional superheterodyne scheme is applied.
Figure 10B:
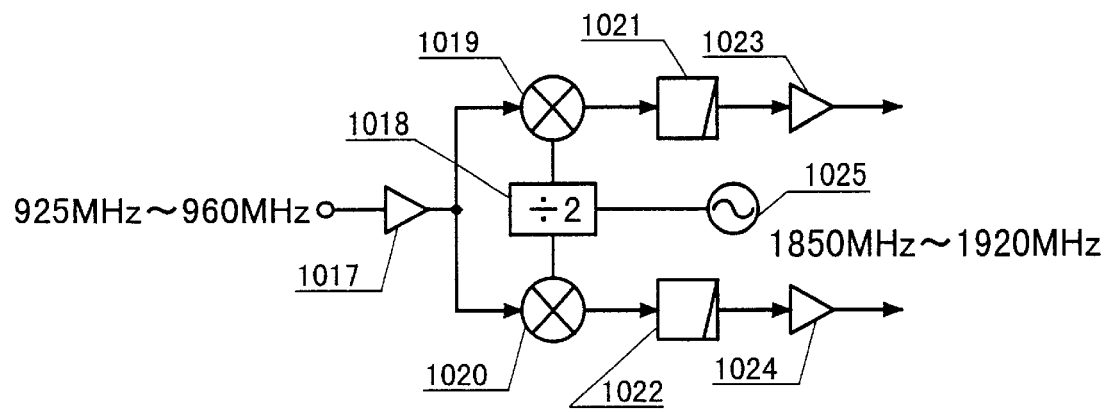
FIG. 10B is a block diagram illustrating the configuration of a prior art direct conversion receiver.
Figure 11:
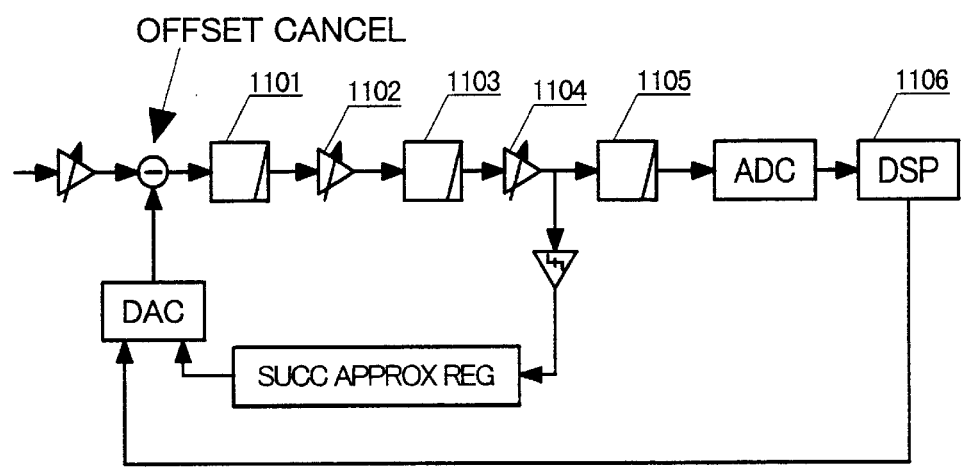
FIG. 11 shows a prior art DC offset voltage canceling technique.

Next, a mobile communication apparatus according to a seventh embodiment of the present invention will be described with reference to FIG. 9. This embodiment shows a mobile communication apparatus characterized in that a baseband circuit 901 is added to the first embodiment. A block 907 includes all circuits other than an antenna 139 and a circuit 143 contained in IC in the first embodiment. The baseband circuit 901 performs signal processing such as conversion of received baseband signals 902, 903 to audio signals, conversion of audio signals to transmission baseband signals 905, 906, and so on. Further, the baseband circuit 901 outputs a DC offset cancel starting signal 904 for determining the timing at which a DC offset voltage is canceled in the circuit 143, and inputs the signal 904 to the circuit 143. The starting signal is sent before a receiver starts receiving a signal, such that a DC offset generated in the circuit 143 is removed before receiving the signal.

Figure 14:
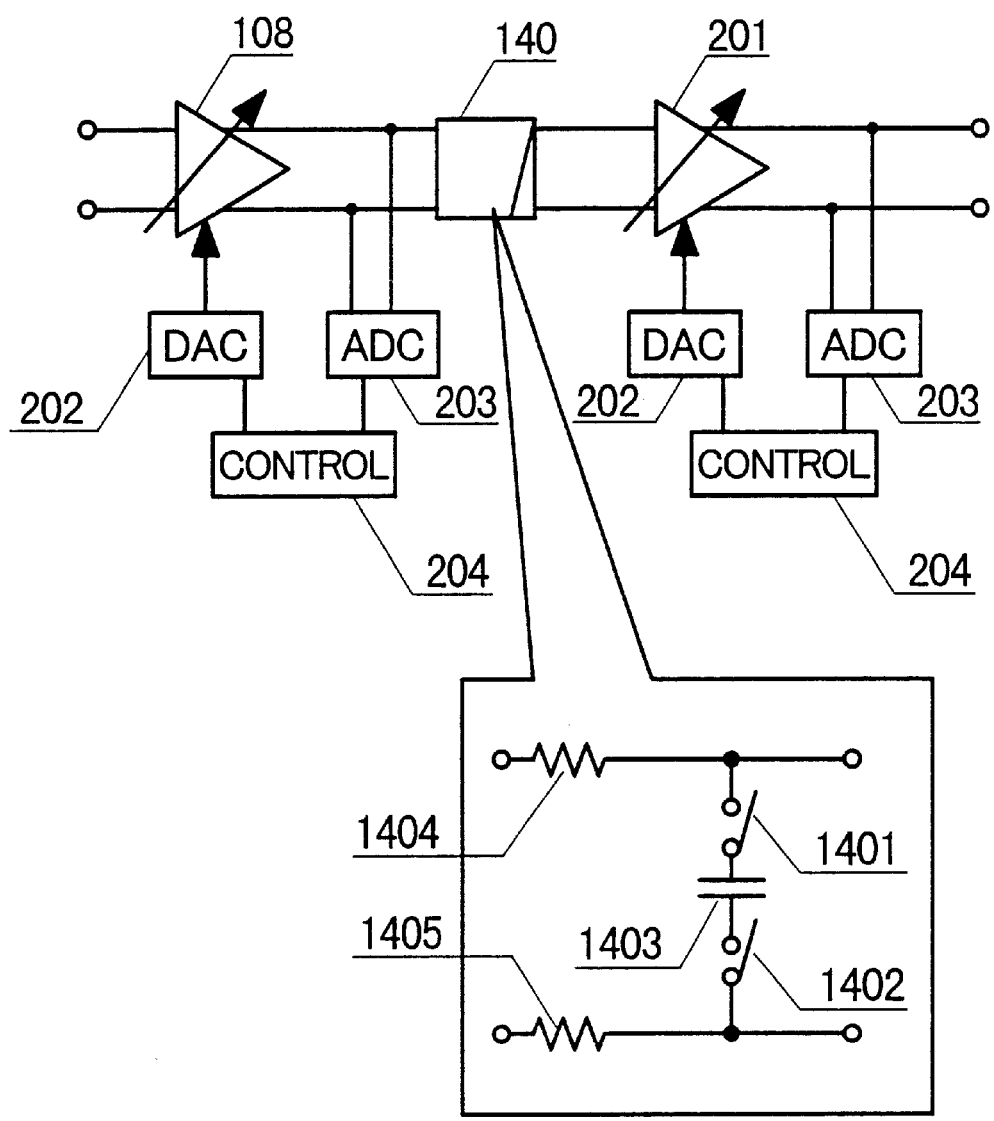
FIG. 14 shows a method of decoupling a filter capacitance to accelerate a DC offset removing operation.

Next, a mobile communication apparatus according to an eighth embodiment of the present invention will be described with reference to FIG. 14. Switches 1401, 1402 are inserted between a capacitance 1403 and resistors 1404, 1405 in a filter 140 to reduce the time constant during DC offset cancellation. Since this can reduce a propagation delay through the filter 140, the DC offset can be canceled faster without using the input short-circuiting switch 801 illustrated in FIG. 8. Also, when respective amplifiers 108, 201 are comprised of bipolar transistors as illustrated in FIG. 3, the bases of the transistors are biased through filter resistors 1404, 1405. Therefore, the DC offset voltage can be canceled, including a bias offset due to variations in base current and variations in filter resistor. On the other hand, the sixth embodiment employing the short-circuiting switch 801 cannot cancel the bias offset. In addition, when the DC offset is removed in order from former stages, a residual error is removed by the DC offset canceling function at a later stage, so that a more accurate DC offset removal can be achieved.

Figure 15:
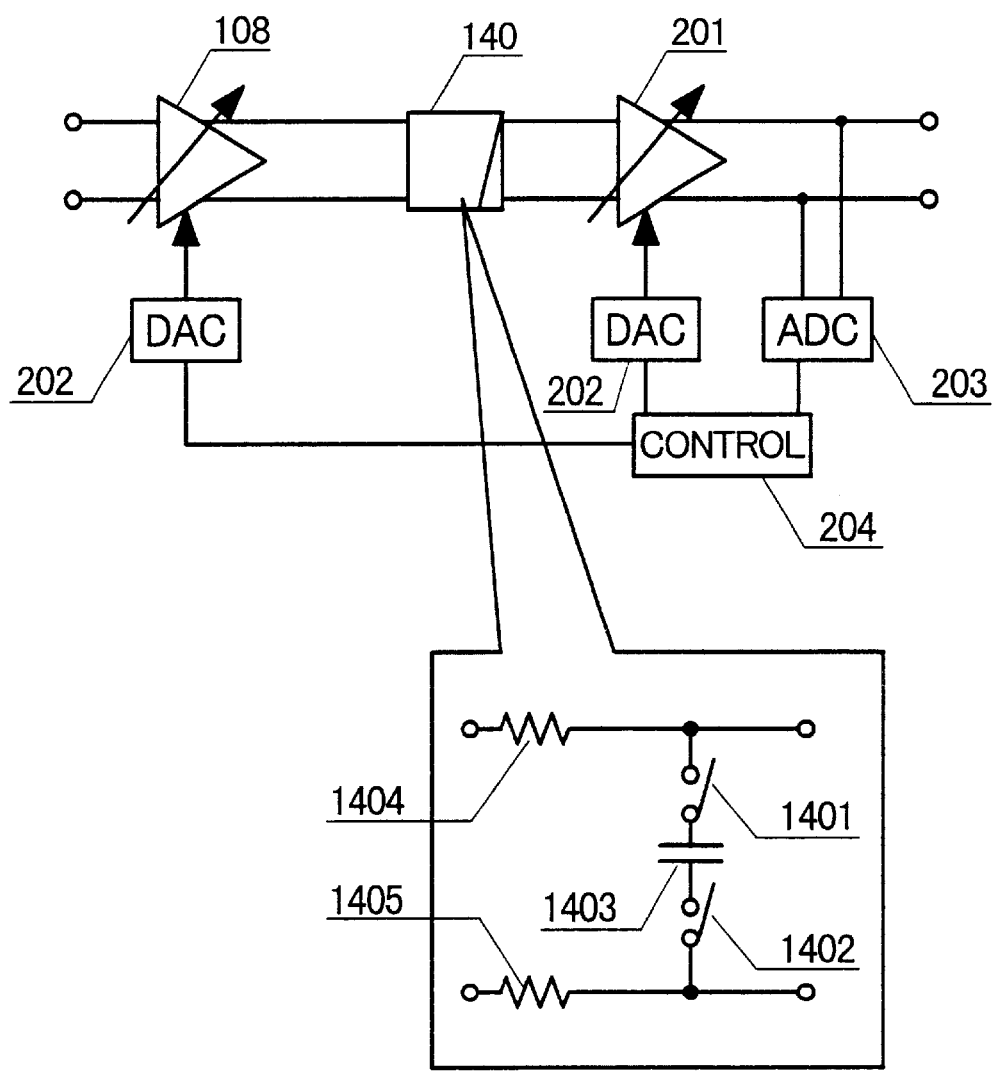
FIG. 15 shows a method of decoupling a filter capacitance to simplify a DC offset removing circuit.

Next, a mobile communication apparatus according to a ninth embodiment of the present invention will be described with reference to FIG. 15. When a propagation delay through the filter is reduced as in the eighth embodiment, the filter can be interposed in a feedback loop for canceling the DC offset voltage. Therefore, this embodiment can reduce the number of ADCs and accordingly the scale of the circuit, as compared with the eighth embodiment.

According to the present invention, three externally connected filters and one externally connected VCO can be saved as compared with the conventional superheterodyne receiver. In addition, it is possible to realize a mobile communication apparatus which can support a high speed packet transmission mode with a reduced number of parts by removing fast a DC offset voltage which causes a problem in the direct conversion receiver.

What is claimed is:

1. A transceiver comprising:
   a receiver including a first voltage controlled oscillator (VCO), first and second dividers connected to an output of said first VCO, a first mixer receiving an output signal of said first divider and a first RF signal, and a second mixer receiving an output signal of said second divider and a second RF signal; and
   a transmitter including a third divider, connected to the output of said first VCO, having means for switching a first division ratio and a second division ratio, a second VCO, a fourth divider, connected to an output of said second VCO, having means for switching a third division ratio and a fourth division ratio, a third mixer receiving an output signal of said fourth divider and a baseband signal, and a frequency conversion circuit for converting the frequency of an output signal of said third mixer using an output signal of said third divider.

2. A transceiver according to claim 1, wherein:
   said first divider has a division ratio of two, and said second divider has a division ratio of four.

3. A transceiver according to claim 2, wherein:
   said first division ratio $\underline{m}$ and said second division ratio $\underline{n}$ satisfy a condition that an output frequency of said third mixer can be set at $|2 \cdot (frf1)/n - ftx1|$ and $|(4 \cdot frf2)/m - ftx2|$ by switching the division ratio of said fourth divider within a frequency range in which said second VCO can oscillate, where frf1 is a frequency of said first RF signal; frf2 is a frequency of said second RF signal; and ftx1, ftx2 are first and second output frequencies of said frequency conversion circuit.

4. A transceiver according to claim 3, wherein:
   said frequency conversion circuit comprises a phase comparator, a first low pass filter, third and fourth VCOs, and a fourth mixer; and
   said phase comparator outputs a signal proportional to a difference in phase between an output signal of said third mixer and an output signal of said fourth mixer, said first low pass filter is connected to an output of said phase comparator, said third and fourth VCOs are connected to an output of said first low pass filter, and said fourth mixer is a mixer which includes a phase locked loop (PLL) for mixing an output signal of said third or fourth VCO with the output signal of said third divider.

5. A transceiver comprising:

a variable gain low pass filter receiving a baseband signal; and an offset voltage canceling circuit including means for canceling a DC offset voltage of said variable gain low pass filter, said variable gain low pass filter including a variable gain amplifier and a low pass filter;

wherein said offset voltage canceling circuit includes an analog-to-digital converter (ADC) receiving an output signal of said variable gain amplifier, a controller for detecting a DC offset voltage of said variable gain amplifier from an output signal of said ADC to output a signal for canceling said DC offset voltage, and a digital-to-analog converter (DAC) receiving the output signal of said controller to output a signal to said variable gain amplifier;

said variable gain amplifier comprises first and second transistors having their emitters connected to each other, a first resistor connected to a collector of said first transistor and a power supply, a second resistor connected to a collector of said second transistor and said power supply, and a variable current source connected to said emitters, wherein a signal is inputted from bases of said first and second transistors, and a signal is outputted from the collectors of said first and second transistors; and said DAC comprises a plurality of voltage-to-current converters each including a third transistor and a third resistor connected to the emitter of said third transistor and a ground, said third transistor having a collector connected to the collector of said first transistor, and said third transistor having a base connected to an output of said controller.

6. A transceiver comprising:

a variable gain low pass filter receiving a baseband signal; and an offset voltage canceling circuit including means for canceling a DC offset voltage of said variable gain low pass filter, said variable gain low pass filter including a variable gain amplifier and a low pass filter;

wherein said variable gain low pass filter comprises a differential circuit;

said variable gain amplifier is a chopper type amplifier having first and second input terminals and first and second output terminals;

said chopper type amplifier includes a third variable gain amplifier having third and fourth input terminals and third and fourth output terminals, a first switch, and a second switch; and said first and second switches are controlled to switch between a first state in which said first input terminal is connected to said third input terminal; said second input terminal to said fourth input terminal; said first output terminal to said third output terminal; and said second output terminal to said fourth output terminal, and a second state in which said first input terminal is connected to said fourth input terminal; said second input terminal to said third input terminal; said first output terminal to said fourth output terminal; and said second output terminal to said third output terminal, said first and second states being periodically switched.

7. A mobile communication apparatus comprising:

an antenna;

an antenna switch connected to said antenna;

a plurality of power amplifiers for outputting signals to said antenna switch;

a plurality of bandpass filters connected to said antenna switch; and a transceiver connected to said bandpass filters, said power amplifiers and a baseband circuit, said transceiver being said transceiver according to claim 1; and said baseband circuit supplying said transceiver with a signal for defining a timing at which a DC offset voltage canceling operation is started.

8. A mobile communication apparatus according to claim 7 wherein:

said antenna switch is a duplexer.

* * * * *

UNITED STATES PATENT AND TRADEMARK OFFICE
CERTIFICATE OF CORRECTION

PATENT NO.     : 6,826,388 B1
DATED          : November 30, 2004
INVENTOR(S)    : S. Tanaka et al.

It is certified that error appears in the above-identified patent and that said Letters Patent is hereby corrected as shown below:

<u>Title page,</u>
Item [73], Assignee, should read -- Renesas Technology Corp., Tokyo (JP)
                                    TTPCom Limited, Hertfordshire (GB) --.

Signed and Sealed this

Twenty-first Day of March, 2006

JON W. DUDAS
*Director of the United States Patent and Trademark Office*